United States Patent [19]

Ito et al.

[11] Patent Number: 4,985,227

[45] Date of Patent: Jan. 15, 1991

[54] METHOD FOR SYNTHESIS OR DIAMOND

[75] Inventors: Toshimichi Ito; Masaaki Nosaka; Ikuo Hosoya, all of Chiba, Japan

[73] Assignee: Indemitsu Petrochemical Co., Ltd., Tokyo, Japan

[21] Appl. No.: 184,561

[22] Filed: Apr. 21, 1988

[30] Foreign Application Priority Data

| Apr. 22, 1987 | [JP] | Japan | 62-99118 |
| May 2, 1987 | [JP] | Japan | 62-109193 |
| Nov. 28, 1987 | [JP] | Japan | 62-301035 |

[51] Int. Cl.$^5$ ............................................. C01B 31/65
[52] U.S. Cl. .............................. 423/446; 156/DIG. 68; 204/173; 427/39
[58] Field of Search ............... 423/446; 156/DIG. 68; 204/173; 427/39

[56] References Cited

U.S. PATENT DOCUMENTS

| 3,030,187 | 4/1962 | Eversole | 423/446 |
| 3,030,188 | 4/1962 | Eversole | 423/446 |
| 3,371,996 | 3/1968 | Hibshman | 423/446 |
| 3,911,918 | 10/1975 | Spero et al. | 219/10.55 F |
| 4,020,311 | 4/1977 | Churchland | 219/10.55 F |
| 4,323,745 | 4/1982 | Berggren | 219/10.55 F |
| 4,329,557 | 5/1982 | Staats | 219/10.55 F |
| 4,367,744 | 11/1982 | Mercier et al. | 219/10.55 F |
| 4,434,188 | 2/1984 | Kamo et al. | 423/446 |
| 4,480,164 | 10/1984 | Dills | 219/10.55 F |
| 4,621,179 | 11/1986 | Kusunoki et al. | 219/10.55 F |
| 4,729,341 | 3/1988 | Fournier et al. | 219/10.55 F |
| 4,776,918 | 10/1988 | Otsubo et al. | 156/345 |
| 4,869,924 | 9/1989 | Ito | 422/39 |

FOREIGN PATENT DOCUMENTS

| 628567 | 10/1961 | Canada | 423/446 |
| 1456871 | 9/1965 | France | 423/446 |
| 2524620 | 4/1982 | France . | |
| 58-91100 | 5/1983 | Japan . | |
| 58-110494 | 7/1983 | Japan . | |
| 58-135117 | 8/1983 | Japan . | |
| 59-18197 | 1/1984 | Japan | 423/446 |
| 59-63732 | 4/1984 | Japan . | |
| 60-103099 | 6/1985 | Japan . | |
| 60-191097 | 9/1985 | Japan | 423/446 |
| 61-36200 | 7/1986 | Japan . | |
| 62-44578 | 2/1987 | Japan . | |
| 62-138395 | 6/1987 | Japan | 423/446 |
| 62-265198 | 11/1987 | Japan . | |
| 62-298106 | 12/1987 | Japan . | |
| 64-24094 | 1/1989 | Japan . | |
| 140985 | 4/1980 | U.S.S.R. | 423/446 |

OTHER PUBLICATIONS

Japanese Journal of Applied Physics, vol. 26, No. 6, Jun. 1987, pp. L1032-L1034.
Paper "A" Entitled "Vapor Phase Synthesis of Diamond in Inorganic Material Institute" with Partial Translation.
Paper "B" Entitled "Characterization of Vapor Phase Synthesized Diamond" with Partial Translation.
Chemical Abstracts, vol. 94, No. 16, Apr. 1981, p. 149, Abstract No. 124025x, Columbus, Ohio, U.S.; & PL-A-106 278 (Politechnika Warszawska) 31-12-1979.
Thin Solid Film, vol. 117, No. 2, Jul. 1984, pp. 125-130, Elsevier Sequoia, Lausanne, CH; D. Nir et al.: "Diamond Like Carbon Films of Low Hydrogen Contents Made with a Mixture of Hydrocarbon and Reactive Gas", p. 125.

Primary Examiner—Olik Chaudhuri
Assistant Examiner—Robert Kunemund
Attorney, Agent, or Firm—Armstrong, Nikaido, Marmelstein, Kubovcik & Murray

[57] ABSTRACT

The following are disclosed:

A method for synthesis of diamond which is characterized by contacting a gas obtained by excitation of carbon monoxide and hydrogen in such a ratio as carbon monoxide being at least 1 mol % per total of carbon monoxide and hydrogen with a substrate in the presence of a reducing metal.

A method for synthesis of diamond which is characterized by contacting with a substrate a gas obtained by excitation of carbon dioxide and hydrogen mixed at such a ratio of carbon dioxide being 0.1-20 mol % per hydrogen.

A method for synthesis of diamond by depositiong diamond on the surface of a substrate by introducing (Abstract continued on next page.)

onto the surface of the substrate a plasma obtained from hydrogen and carbon source gas by irradiation of microwave in a plasma generator which is characterized in that progress of microwave oscillated from one microwave oscillator is divided and thus divided respective microwaves and led to a plurality of plasma generators.

A diamond synthesis apparatus which is characterized by comprising a microwave oscillator for oscillation of microwave, a branched waveguide for dividing the microwave oscillated from said microwave oscillator and a plurality of plasma generators which are connected with said branched waveguide and have a substrate for deposition of diamond, respectively.

6 Claims, 1 Drawing Sheet

METHOD FOR SYNTHESIS OR DIAMOND

BACKGROUND OF THE INVENTION

This invention relates to a method for synthesis of diamond and more particularly it relates to a method for synthesis of diamond usable widely for, for example, various protective films, optical materials, electronic materials and chemical industry materials by rapid and efficient deposition of diamond.

PRIOR ART AND PROBLEMS THEREOF

Recently, technique for synthesis of diamond has been remarkably developed and there have been known CVD methods such as plasma CVD method which comprises decomposing a hydrocarbon by plasma to form hard carbon on a substrate and chemical transport method which comprises forming hard carbon film on a substrate by disproportionation reaction and ionization vapor deposition methods which use hot-cathode PIG guns, cold-cathode PIG guns or sputtering guns.

The conventionally proposed methods use hydrocarbon or mixed gas of hydrocarbon and hydrogen as raw material [cf. Japanese Patent Application Kokai (Laid-open) Nos. 91100/83, 110494/83, 135117/83, 63732/84 and 103099/85] and these methods suffer from the problem of low deposition rate of diamond.

In order to improve the deposition rate, it has been proposed to use a raw material gas comprising a mixed gas of hydrocarbon and hydrogen which further contains carbon monoxide [cf. Japanese Patent Application Kokai (Laid-open) No. 191097/85].

However, this method has a new problem that carbon monoxide must be additionally contained in the conventionally used raw material gas and thus preparation of the raw material gas becomes complicated and the operation therefor is troublesome. This method has further significant problem that when amount of carbon monoxide added to hydrocarbon is more than 10 vol %, content of oxygen in artificial diamond deposited on the surface of substrate becomes too high and crystal structure of diamond is damaged.

Furthermore, Japanese Patent Application Kokai (Laid-open) No. 265198/87 (Laid-open date; Nov. 18, 1987) which was laid-open after filing of Japanese patent application from which the present application claimed convention priority discloses a method for synthesis of diamond which comprises feeding a mixed gas of hydrogen and carbon dioxide or hydrogen and carbon monoxide to a reaction vessel under reduced pressure and applying electromagnetic energy such as microwave or high radio frequency to said mixed gas to generate plasma thereby to synthesize diamond on a substrate.

However, according to examples given in the specification of said laid-open patent application, production rate of diamond is 0.1–8 μm/hr.

Among various synthetic techniques referred to hereabove, especially the microwave plasma CVD method is promising because it is superior in reproducibility of activated state and besides it includes no consumption parts.

However, since in the conventional microwave plasma CVD method, microwave oscillated from one microwave oscillator is introduced into plasma generator [Japanese Patent Application Kokai (Laid-open) No. 91100/84], many apparatuses each of which consists of a pair of microwave oscillator and plasma generator are required in order to produce diamond thin films simultaneously and in a large quantity. Therefore, this CVD method is low in production efficiency and industrially disadvantageous.

Therefore, before the filing of the Japanese patent application from which the present application claims convention priority, method for industrial synthesis of diamond which is simple in operation, high in deposition rate and superior in production efficiency has been demanded.

SUMMARY OF THE INVENTION

Figure 1:
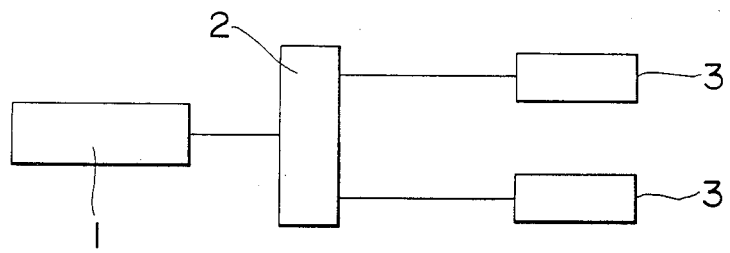
FIG. 1 is a diagrammatical view of an apparatus for synthesis of diamond according to this invention and FIG. 2 illustrates one example of plasma generator which constitutes said apparatus.

The object (1) of this invention is to provide a method for synthesis of diamond free from disorder of crystal structure which is high in deposition rate, very simple in operation for preparation of raw material gas and superior in production efficiency by any methods of high radio frequency plasma CVD method, microwave plasma CVD method, hot filament CVD method, chemical transport method, ionization vapor deposition method and ion beam vapor deposition method.

Another object (2) of this invention is to provide a method for production of industrially useful diamond according to which the above problems are solved and mass production of diamond thin film can be accomplished by microwave plasma CVD method and an apparatus suitable for carrying out this method.

Still another object (3) of this invention is to provide a method for industrial synthesis of diamond according to which diamond can be synthesized at higher deposition rate than by the method disclosed in Japanese Patent Kokai (Laid-open) No. 265198/87.

This invention for attaining the above object (1) is a method for synthesis of diamond which is characterized by contacting with a substrate a gas obtained by excitation of carbon monoxide and hydrogen in such a proportion as carbon monoxide being at least 1 mol % per total of carbon monoxide and hydrogen.

This invention for attaining the object (1) is a method for synthesis of diamond which is characterized by contacting with a substrate a gas obtained by excitation of carbon dioxide and hydrogen mixed at such a ratio of carbon dioxide being 0.1–20 mol % per hydrogen.

This invention for attaining the above objects (1), (2) and (3) is a method for synthesis of diamond by depositing diamond on the surface of a substrate by introducing onto the surface of the substrate a plasma obtained from hydrogen and carbon source gas by irradiation of microwave in a plasma generator which is characterized in that progress of microwave oscillated from one microwave oscillator is branched and thus branched respective microwaves are led to a plurality of plasma generators.

This invention for attaining the above objects (1), (2) and (3) is an apparatus for synthesis of diamond which is characterized by comprising a microwave oscillator for oscillation of microwave, a branching waveguide for branching the microwave oscillated from said microwave oscillator and a plurality of plasma generators which are connected with said branching waveguide and have a substrate for deposition of diamond, respectively.

DESCRIPTION OF THE INVENTION (A) Raw material gases

Raw materials for synthesis of diamond in this invention are carbon source gas and hydrogen gas.

In more detail, raw materials in this invention are (1) a mixed gas containing carbon monoxide and hydrogen at such a ratio as carbon monoxide being at least 1 mol %, (2) a mixed gas containing carbon dioxide and hydrogen at such a ratio as carbon dioxide being 0.1-20 mol % per hydrogen or (3) hydrogen gas and carbon source gas when the apparatus for synthesis of diamond according to this invention is used.

The carbon monoxide has no special limitation and there may be used, for example, producer gas or water gas which is obtained by reaction of coal or coke with air or water vapor with heating and which is sufficiently purified.

The carbon dioxide also has no limitation and there may be used, for example, that which is obtained by producing a gas by strong heating of limestone or combustion of coal, absorbing the resulting gas in a carbonate solution to produce a bicarbonate and heating and purifying this.

As the carbon source gas, there may be effectively used, for example, paraffinic hydrocarbons such as methane, ethane, propane and butane; olefinic hydrocarbons such as ethylene, propylene and butylene; hydrocarbons of acetylene series such as acetylene and allylene; olefinic hydrocarbons such as butadiene; alicyclic hydrocarbons such as cyclopropane, cyclobutane, cyclopentane and cyclohexane; aromatic hydrocarbons such as cyclobutadiene, benzene, toluene, xylene and naphthalene; ketones such as acetone, diethyl ketone and benzophenone; alcohols such as methanol and ethanol; amines such as trimethylamine and triethylamine; carbon monoxide and carbon dioxide; and furthermore, although not single substances, the following may also be used; petroleums such as gasoline, kerosine, turpetine oil, camphor oil, oil obtained by dry distillation of roots of pine, heavy oil, gear oil and cylinder oil. These carbon compounds may also be used as mixtures thereof.

Among these carbon source gases, preferred are oxygen-containing compounds such as ketones e.g. acetone and benzophenone, alcohols e.g. methanol and ethanol, carbon monoxide and carbon dioxide and nitrogen-containing compounds such as amines, e.g., triethylamine and especially preferred are carbon monoxide and carbon dioxide and further preferred are carbon monoxide.

The hydrogen usable has no special limitation and there may be used, for example, those which are obtained by gasification of petroleums, conversion of natural gas and water gas, electrolysis of water, reaction of iron and water vapor and complete gasification of coal and are sufficiently purified.

When carbon monoxide and hydrogen are used as raw material gases, content of carbon monoxide is at least 1 mol %, preferably at least 3 mol %, more preferably at least 5 mol % per total of carbon monoxide and hydrogen.

When content of carbon monoxide is less than 1 mol %, diamond tends not to be produced or, even if produced, deposition rate tends to be extremely low.

When carbon dioxide and hydrogen are used as raw material gases, content of carbon dioxide is 0.1-20 mol %, preferably 0.1-10 mol % per hydrogen.

If content of carbon dioxide is less than 0.1 mol %, diamond tends not to be produced or, even if produced, deposition rate tends to be extremely low. If content of carbon dioxide is more than 20 mol %, graphite tends to be produced.

When the carbon source gas and the hydrogen gas are used as raw material gases, amount of the carbon source gas used varies depending on kinds of the carbon source gas and cannot be generally determined. When carbon monoxide is used as the carbon source gas and when carbon dioxide is used, amounts thereof are as mentioned above.

In the method of this invention, inert gas can be used as carrier for the raw material gases.

Typical examples of inert gas are argon gas, neon gas, helium gas, xenon gas and nitrogen gas.

These may be used alone or in combination of two or more.

(B) Substrate

The substrate with which the gas obtained by excitation of said raw material gases is allowed to contact is not critical and there may be used any of, for example, metals such as silicon, aluminum, titanium, tungsten, molybdenum, cobalt and chromium, oxides, nitrides and carbides of these metals, alloys of these metals, cermets such as $Al_2O_3$-Fe, TiC-Ni, TiC-Co and $B_4C$-Fe systems and various ceramics.

(C) Excitation of raw material gas

For obtaining gases by excitation of the raw material gas, known methods can be employed such as plasma CVD method, sputtering method, ionization vapor deposition method, ion beam vapor deposition method, hot filament method and chemical transport method.

When plasma CVD method is used, said hydrogen produces atomic hydrogen after forming plasma by irradiation of high radio frequency or microwave and when CVD methods such as the chemical transport method and hot filament method are used, said hydrogen produces atomic hydrogen by heat or discharging.

This atomic hydrogen has action of removing carbon of graphite structure deposited simultaneously with deposition of diamond.

When said plasma CVD apparatus is used, diamond can be efficiently produced from any raw material gases of the above (1), (2) and (3) by employing the method which comprises branching progress of microwave oscillated from one microwave oscillator and leading respective branched microwave to a plurality of plasma generators.

This effective method for production of diamond can be realized by using an apparatus for synthesis of diamond which is characterized by comprising a microwave oscillator which oscillates microwave, branching waveguide which branches progress of the microwave oscillated from said microwave oscillator in a plurality of directions and plurality of plasma generators connected with said branching waveguide and having substrate for deposition of diamond, respectively.

Next, the apparatus for synthesis of diamond will be explained below.

As shown in FIG. 1, this apparatus for synthesis of diamond has one microwave oscillator 1, one branching waveguide 2 and two plasma generators 3.

Said microwave oscillator 1 has oscillating function at microwave band (frequency 1000 MHz-100 GHz)

and examples thereof are conventional microwave tubes such as velocity modulation tube, klystron and magnetron.

In this invention, especially ISM frequency band can be suitably used among microwaves.

The branching waveguide 2 shown in FIG. 1 is formed so that it uniformly branches the microwave oscillated from microwave oscillator 1 in two directions and leads respective microwaves branched in two directions to respective plasma generators 3. In this example, two-direction branching waveguide is shown which uniformly branches microwave oscillated from microwave oscillator 1 in two directions. When a microwave of one direction is to be branched to three or more directions, for example, the two-direction branching waveguides are combined and microwave oscillated from microwave oscillator is branched into two directions by the first two-direction branching waveguide and one of the branched microwaves is branched into two directions by the second two-direction branching waveguide. As a result, a microwave can be branched into three directions. In this case, the microwave is branched by two two-direction branching waveguides so as to obtain intensities of 2:1:1. However, it is also possible to branch a microwave into two or more, for example, by employing T-type branching tube, E-cornered waveguide, three branching tube or combination thereof without using a plurality of the two-direction branching waveguide.

Furthermore, not only a microwave can be branched in equal intensity by combination of branching waveguides, but also it can be branched at desired intensity ratio.

In this invention, excitation of a mixed gas can be attained by leading the microwaves branched by branching waveguide 2 to a plurality of plasma generators connected with said branching waveguide 2 and irradiating the microwaves to mixed gas of hydrogen and carbon source gas, carbon monoxide gas or carbon dioxide gas with the microwaves to produce plasma.

Figure 2:
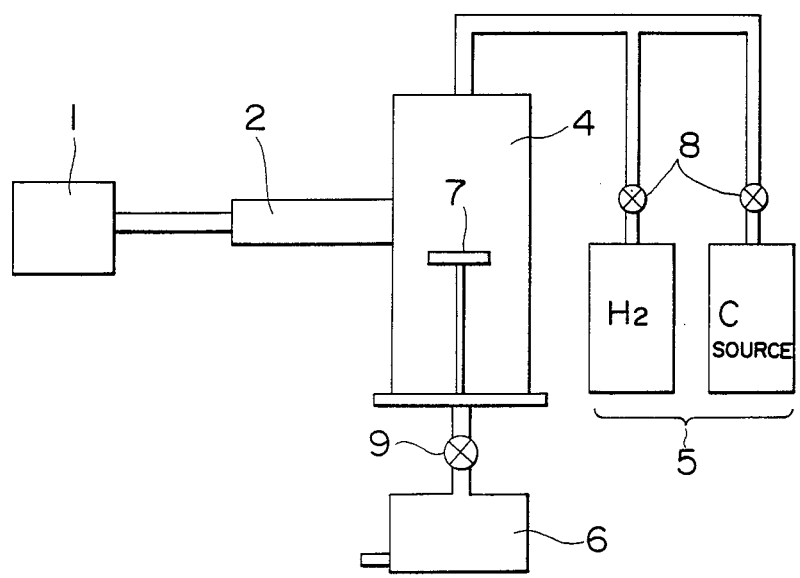

As shown in FIG. 2, the plasma generator 3 has gas feeding device 5 for feeding a mixed gas of hydrogen gas and carbon source gas, carbon monoxide gas or carbon dioxide gas to reaction chamber 4 and exhaustion device 6 for pumping the reaction gas after used from reaction chamber 4, this reaction chamber 4 containing substrate 7 on which diamond is to be deposited. Substrate 7 is, if necessary, heated by a heating furnace and then is used.

Substrate 7 is not critical as mentioned above.

Feeding amount and pumping amount of the mixed gas can be adjusted by feeding amount adjusting valve 8 and pumping amount adjusting valve 9, respectively.

Connection of plasma generator 3 and branching waveguide 2 is performed through an applicator per se known.

In this invention, microwave oscillated from said one microwave oscillator is branched so that irradiation intensity thereof to the respective mixed gas of hydrogen gas and carbon source gas fed to the reaction chamber of the plasma generator is ordinarily at least 0.1 kw, preferably at least 0.2 kw. When irradiation intensity per one plasma generator is less than 0.1 kw, sometimes, deposition rate of diamond is low or no diamond is deposited.

The following operation is carried out for producing diamond by the synthesis apparatus of this invention.

That is, a mixed gas of said hydrogen gas and carbon source gas is fed to reaction chamber 4 of plasma generator 3 shown in FIG. 2 by gas feeding device 5.

Then, microwave oscillated from microwave oscillator 1 and branched by branching waveguide 2 is irradiated to the mixed gas fed to reaction chamber 4 in each plasma generator 3 to produce plasma, thereby to excite the mixed gas.

The mixed gas thus in excited state reaches the surface of substrate 7 to deposit diamond on the surface of this substrate.

Reaction gas after use is pumped by exhaustion device 6.

(D) Reaction of synthesis of diamond

In the method of this invention, reaction proceeds under the following conditions and diamond is deposited on the substrate.

That is, reaction temperature of the surface of said substrate varies depending on excitation means of raw material gas and cannot be indiscriminately determined. However, for example, when plasma CVD method is used, it is usually 400°–1,000° C., preferably 450°–950° C. If this temperature is lower than 400° C., sometimes the deposition rate of diamond is lowered or carbon in excited state is not produced. On the other hand, if it is higher than 1,000° C., sometimes diamond deposited on the substrate is scraped by etching and improvement of deposition rate is not seen.

Reaction pressure is usually $10^{-3}$–$10^{3'}$ torr, preferably 1–800 torr. If the reaction pressure is lower than $10^{-3}$ torr, deposition rate of diamond is lowered or diamond is not deposited. On the other hand, even if the reaction pressure is increased to higher than $10^3$ torr, the corresponding effect cannot be obtained.

(E) Reducing metals

In this invention, when carbon monoxide and hydrogen are used as raw material gas, reducing metal may be used in a reaction system.

The reducing metal is preferably at least one metal selected from the group consisting of Group VII metals and Group VIII metals of periodic table.

Specific examples thereof are manganese, iron, nickel, cobalt, platinum and palladium.

These may be used alone or in combination of two or more. When two or more reducing metals are used, these metals may be in the form of a mixture or an alloy.

Powder of the reducing metal may be allowed to be present previously in reaction system or may be continuously fed to the reaction system together with feeding of raw material gas.

The reducing metal in this invention can also be used in the form of a molded body made by pressure molding said powder and moreover, in the form of a metal carried on a carrier.

The inventors consider the mechanism of formation of diamond as follows.

 (I)

 (II)

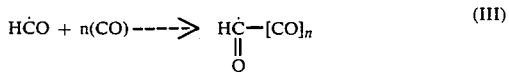 (III)

-continued

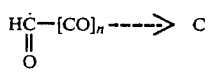 (IV)

As shown in the above formula (I), hydrogen gas in raw material gas is excited and becomes hydrogen radical; as shown in the formula (I), this hydrogen radical reacts with carbon monoxide to produce HĊO; and as shown in the formula (III), this HCO reacts with carbon monoxide to produce CO addition product and this CO addition product is reduced with the reducing metal and oxygen atoms are eliminated to produce diamond.

The diamond which can be obtained by the method of this invention can be suitably utilized for various protecting films such as surface protecting film of cutting tools, optical materials, electronic materials, chemical industry materials.

According to this invention, diamond can be synthesized at high deposition rate using a mixed gas of carbon monoxide and hydrogen or a mixed gas of carbon dioxide and hydrogen as raw material by any of high radio frequency plasma CVD method, microwave plasma CVD method, hot filament CVD method, chemical transport method, ionization vapor deposition method and ion beam vapor deposition method. Therefore, a method for synthesis of industrially useful diamond which has the following effects can be provided.

(1) Complication in preparation of raw material gas or complexity in operation as in case of using hydrocarbons do not occur.

(2) Excellent production efficiency.

(3) No disorder in crystal structure of diamond.

Especially when carbon monoxide and hydrogen are used as raw material gas, deposition rate of diamond can be further increased.

Furthermore, according to this invention, when carbon source gas and hydrogen gas are used as raw material gas, progress of microwave oscillated from one microwave oscillator is branched and thus branched microwaves are led to a plurality of plasma generators. Thus, method for synthesis of diamond and an apparatus for synthesis of diamond having the following various effects can be provided.

(1) A plurality of diamond thin films can be simultaneously produced and this is industrially advantageous.

(2) Since microwave is merely branched, the apparatus for synthesis can be simplified.

(3) One microwave oscillator is used in common by a plurality of plasma generators and thus production efficiency is superior.

This invention will be further explained by the following examples and comparative examples.

EXAMPLE 1

Using a microwave source of 2.45 GHz in frequency, output was set at 500 W under the conditions of a substrate temperature of 900° C. and a pressure of 50 torr. Then, into this reaction chamber were introduced carbon monoxide at a flow rate of 5 sccm and hydrogen at a flow rate of 95 sccm and synthesis of diamond by microwave plasma CVD was effected for 1 hour to obtain a deposit of 10 μm thick on a substrate controlled to the above mentioned temperature. A silicon wafer was used as the substrate.

Raman spectroscopic analysis of the resulting deposit gave a peak due to diamond in the vicinity of 1333 cm$^{-1}$ of Raman scattering spectrum. This shows that the deposit is diamond free from impurities.

COMPARATIVE EXAMPLE 1

Synthesis of diamond was carried out in the same manner as in Example 1 except that methane gas was used in place of carbon monoxide.

As a result, only such deposit as having a thickness of 1.0 μm was obtained and the deposition rate was 1/10 of the deposition rate attained in Example 1.

EXAMPLE 2

Synthesis of diamond was effected in accordance with Example 1 by carrying out the reaction for 1 hour using WC-Co (Co content: 12%) as substrate and under the conditions of substrate temperature of 800° C., a pressure of 40 torr, flow rate of carbon monoxide of 30 sccm and flow rate of hydrogen of 70 sccm. A deposit of 6 μm thick was obtained on the substrate.

Raman spectroscopic analysis of the resulting deposit gave a peak due to diamond in the vicinity of 1333 cm$^{-1}$ of Raman scattering spectrum. This shows that the deposit was a diamond free from impurities.

COMPARATIVE EXAMPLE 2

Synthesis of diamond was effected in the same manner as in Example 2 except that methane gas and carbon monoxide were used in place of carbon monoxide and flow rate of methane gas was 5 sccm and that of carbon monoxide was 3 sccm.

As a result, only such deposit of 3 μm thick was obtained and deposition rate was ½ of the rate in Example 2.

EXAMPLE 3

Synthesis of diamond was effected in the same manner as in Example 1 except that a silicon substrate was used and reaction was carried out for 1 hour under the conditions of a microwave output of 400 W, a substrate temperature of 800° C., a pressure of 40 torr, a flow rate of carbon monoxide of 80 sccm and that of hydrogen of 20 sccm. A deposit of 12 μm thick was obtained on the substrate.

Raman spectroscopic analysis of the deposit gave a peak due to diamond in the vicinity of 1333 cm$^{-1}$ of Raman scattering spectrum which shows that the deposit was diamond free from impurities.

COMPARATIVE EXAMPLE 3

Synthesis of diamond was effected in the same manner as in Example 3 except that flow rate of carbon monoxide was 0.5 sccm and flow rate of hydrogen was 100 sccm.

As a result, the whole surface of the substrate was not covered with film of diamond even after reaction for 1 hour.

EXAMPLE 4

Using a microwave source of 2.45 GHz in frequency, output was set at 600 W under the conditions of a substrate temperature of 900° C. and a pressure of 50 torr. Then, into this reaction chamber were introduced carbon dioxide at a flow rate of 0.3 sccm and hydrogen at a flow rate of 100 sccm and synthesis of diamond by microwave plasma CVD method was effected for 6 hour to obtain a deposit of 1 μm thick on a substrate controlled to the above mentioned temperature. A silicon wafer was used as the substrate.

Raman spectroscopic analysis of the resulting deposit gave a peak due to diamond in the vicinity of 1333 cm$^{-1}$ of Raman scattering spectrum. This shows that the deposit is diamond free from impurities.

EXAMPLE 5

Synthesis of diamond was effected in accordance with Example 5 by carrying out the reaction for 5 hour using WC-Co (Co content: 12%) as substrate and under the conditions of substrate temperature of 930° C., a pressure of 50 torr, flow rate of carbon dioxide of 5.0 sccm and flow rate of hydrogen of 95 sccm. A deposit of 2 μm thick was obtained on the substrate.

Raman spectroscopic analysis of the resulting deposit gave a peak due to diamond in the vicinity of 1333 cm$^{-1}$ of Raman scattering spectrum. This shows that the deposit was a diamond free from impurities.

EXAMPLE 6

Methane gas and hydrogen gas were respectively introduced into a reaction tube containing a silicon wafer as a substrate.

Then, output of microwave oscillator was set at 2.4 kw and said output was branched into equal two directions by first two-direction branching waveguide and then said output was further branched into two direction by two second two-direction branching waveguide to branch into equal four outputs after all. 0.6 kw each of them was fed to each reaction tube to perform discharging. Amount of methane gas and that of hydrogen gas were 0.5 sccm and 100 sccm, respectively.

Deposition was carried out for 4 hours in the above state to obtain simultaneously thin films of 2 μm thick on each of four substrates.

Raman spectroscopic analysis of the resulting thin films showed that all thin films were diamond free from impurities.

EXAMPLE 7

Example 6 was repeated except that acetone was used in place of methane gas to obtain simultaneously thin films of 10 μm thick on four substrates. Raman spectroscopic analysis of the thin films showed that all of the thin films were diamond free from impurities.

What is claimed is:

1. A method for synthesis of diamond which comprises contacting a substrate with a gas consisting essentially of a mixture of excited carbon monoxide gas and excited hydrogen gas at a ratio of carbon monoxide of 1-80 mol % per total of carbon monoxide and hydrogen.

2. A method according to claim 1 wherein the excitation is effected by plasma CVD method.

3. In a method for synthesis of diamond which comprises contacting a substrate with a plasma obtained from hydrogen gas and carbon source gas by irradiation with microwave in a plasma reaction chamber to deposit diamond on the surface of the substrate wherein the improvement comprises generating a microwave from a single microwave oscillator generator, branching the generated microwave to produce a plurality of microwaves by a branched wave guide, and leading each branched microwave to different plasma reaction chambers.

4. A method according to claim 1 or 3 wherein the substrate is a material selected from the group consisting of silicon, aluminum, titanium, tungsten, molybdenum, cobalt, chromium, oxides thereof, nitrides thereof, carbides thereof, alloys and cermets thereof.

5. A method according to claim 1 or 3 wherein the reaction temperature of surface of the substrate is 400°-1,000° C.

6. A method according to claim 1 or 2, wherein synthesis of said diamond is conducted at a pressure of $10^{-3}$ to $10^3$ torr.

* * * * *

UNITED STATES PATENT AND TRADEMARK OFFICE
CERTIFICATE OF CORRECTION

PATENT NO. : 4,985,227
DATED : January 15, 1991
INVENTOR(S) : ITO et al

It is certified that error appears in the above-identified patent and that said Letters Patent is hereby corrected as shown below:

On the title page, in the title, Item [54], "METHOD FOR SYNTHESIS OR DIAMOND" should read --METHOD FOR SYNTHESIS OF DIAMOND--.

Column 1, line 1, "METHOD FOR SYNTHESIS OR DIAMOND" should read --METHOD FOR SYNTHESIS OF DIAMOND--.

Signed and Sealed this

Twenty-eighth Day of July, 1992

Attest:

DOUGLAS B. COMER

*Attesting Officer*  *Acting Commissioner of Patents and Trademarks*